US012612711B2

(12) United States Patent
Kim et al.

(10) Patent No.: US 12,612,711 B2
(45) Date of Patent: Apr. 28, 2026

(54) METHOD FOR MANUFACTURING FREE-STANDING SINGLE-CRYSTAL MEMBRANE HAVING PEROVSKITE STRUCTURE, AND METHOD FOR TRANSFERRING FREE-STANDING SINGLE-CRYSTAL MEMBRANE HAVING PEROVSKITE STRUCTURE

(71) Applicant: UNIVERSITY OF ULSAN FOUNDATION FOR INDUSTRY COOPERATION, Ulsan (KR)

(72) Inventors: Tae Heon Kim, Ulsan (KR); Chang Won Ahn, Ulsan (KR); Muhammad Sheeraz, Ulsan (KR)

(73) Assignee: UNIVERSITY OF ULSAN FOUNDATION FOR INDUSTRY COOPERATION, Ulsan (KR)

( * ) Notice: Subject to any disclaimer, the term of this patent is extended or adjusted under 35 U.S.C. 154(b) by 0 days.

(21) Appl. No.: 18/684,120

(22) PCT Filed: Mar. 8, 2022

(86) PCT No.: PCT/KR2022/003228
§ 371 (c)(1),
(2) Date: Feb. 15, 2024

(87) PCT Pub. No.: WO2023/090540
PCT Pub. Date: May 25, 2023

(65) Prior Publication Data
US 2025/0109523 A1 Apr. 3, 2025

(30) Foreign Application Priority Data
Nov. 17, 2021 (KR) ........................ 10-2021-0158148

(51) Int. Cl.
C30B 23/02 (2006.01)
C30B 29/22 (2006.01)

(52) U.S. Cl.
CPC ............ C30B 23/025 (2013.01); C30B 29/22 (2013.01)

(58) Field of Classification Search
CPC ....... C30B 23/02; C30B 23/025; C30B 29/22; C30B 33/08
See application file for complete search history.

(56) References Cited

U.S. PATENT DOCUMENTS 1,943,334 A * 1/1934 Mitchell ................... C22B 3/00
423/109

FOREIGN PATENT DOCUMENTS

JP 06267343 A * 9/1994
JP 2005-294452 A 10/2005
(Continued)

OTHER PUBLICATIONS

Zhicheng Zhong, G. Koster, and Paul J. Kelly, Prediction of thickness limits of ideal polar ultrathin films, Physical Review B 85, 121411(R) (2012) (Year: 2012).*
(Continued)

*Primary Examiner* — Hua Qi
(74) *Attorney, Agent, or Firm* — LEYDIG, VOIT & MAYER, LTD.

(57) ABSTRACT

The present invention provides a method for manufacturing a free-standing single-crystal membrane having a perovskite structure, the method comprising: applying an oxygen-deficient perovskite sacrificial layer having an $ACuO_2$ structure (where A is at least one selected from the group consisting of calcium (Ca), strontium (Sr), and barium (Ba)) on a substrate; epitaxially growing a single-crystal membrane having a perovskite structure on the sacrificial layer;
(Continued)

and selectively removing the sacrificial layer using an etchant, and provides a method for transferring a free-standing single-crystal membrane having a perovskite structure by using the method for manufacturing a free-standing single-crystal membrane having a perovskite structure.

6 Claims, 4 Drawing Sheets

(56)                    References Cited

FOREIGN PATENT DOCUMENTS

| JP | 2014-179580 | A | 9/2014 |
|----|----|----|----|
| KR | 10-1999-0030835 | A | 5/1999 |
| KR | 10-2010-0111117 | A | 10/2010 |
| KR | 10-2021-0108073 | A1 | 9/2021 |

OTHER PUBLICATIONS

Di Lu, David J. Baek, Seung Sae Hong, Lena F. Kourkoutis, Yasuyuki Hikita and Harold Y. Hwang, Synthesis of freestanding single-crystal perovskite films and heterostructures by etching of sacrificial water-soluble layers, Nature Materials | vol. 15 | Dec. 2016, pp. 1255-1261 (Year: 2016).*

Bakaul et al. (2016) "Single crystal functional oxides on silicon," Nat. Commun. 7, 10547.

Bakaul et al. (2017) "High Speed Epitaxial Perovskite Memory on Flexible Substrates," Adv. Mater. 29, 1605699, abstract.

Chen et al. (2019) "Freestanding crystalline YBa_{2}Cu_{3}O_{7--x} heterostructure membranes," Phys. Rev. Mater. 3, 060801(R), accepted manuscript.

Elangovan et al. (Apr. 2020) "Giant Superelastic Piezoelectricity in Flexible Ferroelectric BaTiO3 Membranes," ACS Nano, 14, 5053-5060, abstract.

Hong et al. (2017) "Two-dimensional limit of crystalline order in perovskite membrane films," Sci. Adv. 3, eaao5173.

International Search Report and Written Opinion, dated Aug. 9, 2022, corresponding to International Application No. PCT/KR2022/003228, (from which the present application claims priority,) 6 pp.

Ji et al. (2019) "Freestanding crystalline oxide perovskites down to the monolayer limit," Nature, 570, 87-90.

Lee (Sep. 2020) "Flexoelectricity in thin films and membranes of complex oxides," Apl Materials, 8, 090901.

Lu et al. (2016) "Synthesis of freestanding single-crystal perovskite films and heterostructures by etching of sacrificial water-soluble layers," Nat. Mater. 15, 1255-1260.

Lu et al. (May 2020) "Synthesis of single-crystal $La_{0.67}Sr_{0.33}MnO_3$ freestanding films with different crystal-orientation," APL Mater. 8, 051105.

Samal et al. (2013) "Experimental evidence for oxygen sublattice control in polar infinite layer SrCuO2," Physical review letters, 111, 096102.

Sheeraz (Feb. 2021) "Enhancement of Functional Properties in Complex Oxides via Spatial-Inversion Symmetry Control," PhD thesis defense, Department of Physics and Energy Harvest-Storage Research Center (EHSRC), University of Ulsan, Ulsan 44610, Republic of Korea, 142 pp.

* cited by examiner

Planar structure SrCuO₂                    Chain structure SrCuO₂ c
a → b

Sr    Cu    O

METHOD FOR MANUFACTURING FREE-STANDING SINGLE-CRYSTAL MEMBRANE HAVING PEROVSKITE STRUCTURE, AND METHOD FOR TRANSFERRING FREE-STANDING SINGLE-CRYSTAL MEMBRANE HAVING PEROVSKITE STRUCTURE

CROSS-REFERENCE TO RELATED APPLICATIONS

This application is a U.S. National Stage Application filed under 35 U.S.C. § 371 of International Application No. PCT/KR2022/003228, filed Mar. 8, 2022, which claims the benefit of Korean Application No. 10-2021-0158148, filed Nov. 17, 2021. Both of these applications are incorporated herein by reference.

BACKGROUND OF THE INVENTION

1. Field of the Invention

The present invention relates to a method for manufacturing a free-standing single-crystal membrane having a perovskite structure, and a method for transferring a free-standing single-crystal membrane having a perovskite structure.

2. Description of the Related Art

Over the past several decades, by epitaxially growing transition metal oxides as thin films on single crystal substrates, many prior studies have been conducted to (1) control or improve the physical properties of deposited thin films, or (2) implement new structural phases that do not appear in conventional bulk samples or discover unique physical phenomena. However, in the case of this epi-thin film heterogeneous stacked structure, the upper oxide thin film is strongly fixed/restricted by the lower substrate (i.e., substrate clamping effect), so there is a limit to freely controlling of the epitaxially grown thin film.

Recently, many groups around the world are conducting challenging research related to the production of a free-standing single-crystal membrane free from the lower substrate clamping effects (i.e., with the lower substrate removed). In such a free-standing membrane, the thin film with a thickness of several to tens of nanometers is not constrained by the lower substrate, so the stress state of the membrane can be easily controlled by applying compressive stress or tensile stress from the outside. Furthermore, because the thin film is not fixed on a rigid and stiff single-crystal substrate, the free-standing membrane is extremely flexible and can be mechanically bent.

Experimentally, there are two main methods to prepare a composite oxide-based free-standing membrane with high single-crystal-level crystallinity. The first method is a remote epitaxy technique that uses a two-dimensional material with van der Waals bonds, and the second method is a technique using a sacrificial layer that can be chemically removed by etching. In the case of remote epitaxy, a two-dimensional material with a relatively weak van der Waals bond is sandwiched between a single-crystal substrate and an epi-thin film, and after growing the thin film, mechanical exfoliation is used to separate the upper thin film from the lower substrate to create a free-standing membrane. In the technique using a sacrificial layer, a sacrificial layer that can be chemically removed by distilled water or an etchant such as acid/base is deposited between the lower substrate and the upper thin film, and then the epitaxially grown thin film is separated from the substrate by selectively removing the sacrificial layer during the etching process on the fabricated film, thereby creating a free-standing membrane. According to previous studies reported to date, $Sr_3Al_2O_6$, which is soluble in distilled water, and $(La,Sr)MnO_3$, which can be etched using acidic solutions, are representative compounds that have been used as sacrificial layers. However, the $Sr_3Al_2O_6$ sacrificial layer is known to be etched dissolving in distilled water only in an oxygen-deficient state (i.e., $Sr_3Al_2O_{6-\delta}$), and the $(La,Sr)MnO_3$ sacrificial layer is known to be etched only in acidic solutions.

For example, Korean Patent Publication No. 10-2021-0108073 discloses a technology related to separating an epitaxially grown single-crystal membrane from a substrate. Specifically, it discloses a producing method of an SOI substrate consisting of the following steps: (a) forming a silicon exfoliation layer on one side of the first single-crystal silicon substrate; (b) forming a first single-crystal silicon epitaxial layer on the silicon exfoliation layer; (c) forming a plurality of insulating patterns on one side of the first single-crystal silicon epitaxial layer; (d) forming a second single-crystal silicon epitaxial layer on the first single-crystal silicon epitaxial layer and the insulating patterns; (e) flattening one side of the second single-crystal silicon epitaxial layer; (f) forming a first oxide layer on top of the second single-crystal silicon epitaxial layer; (g) bonding the first single-crystal silicon substrate and the second single-crystal silicon substrate with the second oxide layer formed on the surface thereof; (h) removing the first single-crystal silicon substrate by applying energy to the silicon exfoliation layer; and (i) removing the first single-crystal silicon epitaxial layer while reducing its thickness from the other side to one side. However, this method is a technique that physically separates the grown membrane, and there is a problem that the membrane may be damaged during the physical separation process.

Therefore, the present inventors studied a method for manufacturing a free-standing single-crystal membrane having a perovskite structure that can be etched in various environments without damaging the epitaxially grown membrane, and a method for transferring a free-standing single-crystal membrane having a perovskite structure, and completed the present invention.

SUMMARY OF THE INVENTION

An object of the present invention is to provide a method for manufacturing a free-standing single-crystal membrane having a perovskite structure, and a method for transferring a free-standing single-crystal membrane having a perovskite structure.

To achieve the above object, the present invention provides a method for manufacturing a free-standing single-crystal membrane having a perovskite structure comprising the following steps:

applying an oxygen-deficient perovskite sacrificial layer with an $ACuO_2$ structure (where A is at least one selected from consisting of calcium (Ca), the group strontium (Sr), and barium (Ba)) on a substrate;

epitaxially growing a single-crystal membrane having a perovskite structure on the sacrificial layer; and selectively removing the sacrificial layer using an etchant.

In addition, the present invention provides a method for transferring a free-standing single-crystal membrane having a perovskite structure comprising the following steps:

applying an oxygen-deficient perovskite sacrificial layer with an $ACuO_2$ structure (where A is at least one selected from the group consisting of calcium (Ca), strontium (Sr), and barium (Ba)) on a substrate;

epitaxially growing a single-crystal membrane having a perovskite structure on the sacrificial layer;

selectively removing the sacrificial layer using an etchant; and transferring the free-standing single-crystal membrane having a perovskite structure to a quartz substrate by removing the sacrificial layer.

ADVANTAGEOUS EFFECT

According to the present invention, a free-standing single-crystal membrane can be manufactured using various etching solutions, and the free-standing single-crystal membrane can be transferred, thereby increasing process convenience, and the speed of the etching can be adjusted depending on the situation, and furthermore, the etching can be performed in an environment where the membrane is not damaged.

DESCRIPTION OF THE PREFERRED EMBODIMENTS

Figure 1:
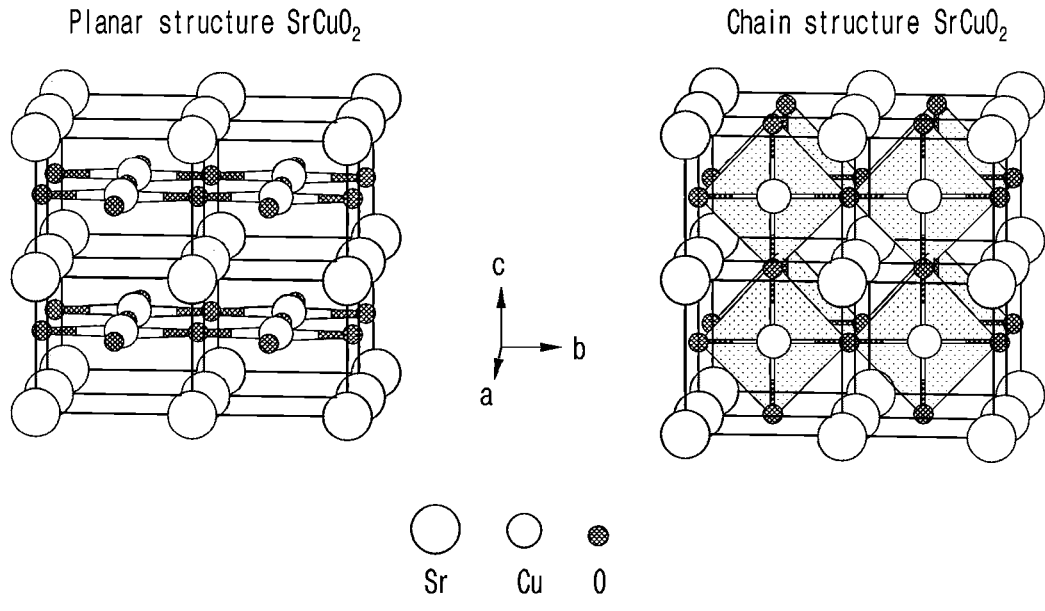
FIG. 1 is a schematic diagram showing the structure of an exemplary sacrificial layer material used in the manufacturing method according to the present invention.

The present invention relates to a method for manufacturing a free-standing single-crystal membrane (single-crystalline freestanding membrane) having a nano-level thickness using a chemically etchable sacrificial layer in a perovskite-based composite oxide epitaxial thin film heterogeneous stacked structure, and a method for transferring using the same.

In the present invention, a free-standing single-crystal membrane of a transition metal oxide, for example, $SrRuO_3$, is prepared by using a sacrificial layer such as $SrCuO_2$ among infinite-layer perovskite oxides (chemical formula: $ABO_2$) having a crystal structure deficient in apical oxygen ions in the perovskite oxide $ABO_3$ structure. In the case of the $SrCuO_2$ sacrificial layer mentioned as an example, since it is already stoichiometrically deficient in oxygen ions, it can be removed using various etchants (i.e., distilled water and acid/base). Also, since the degree of etching varies depending on the type and acidity of the etchant, the etching rate can be selectively adjusted. Thus, by using a sacrificial layer such as this infinite-layer perovskite $SrCuO_2$, it is possible to manufacture a high-quality composite oxide-based free-standing membrane that has a thickness of several to tens of nanometers and exhibits single-crystal level crystallinity. And because the manufactured free-standing membrane such as $SrRuO_3$ is extremely flexible, the physical properties of the membrane can be controlled by mechanically stretching or bending thereof. The method for manufacturing a free-standing membrane introduced in the present invention is applicable to various perovskite-based composite oxides and can be widely applied to artificially realize novel physical properties that do not exist in nature.

Hereinafter, the method for manufacturing standing single-crystal membrane having a perovskite structure of the present invention is described.

The present invention provides a method for manufacturing a free-standing single-crystal membrane having a perovskite structure comprising the following steps:

applying an oxygen-deficient perovskite sacrificial layer with an $ACuO_2$ structure (where A is at least one selected from the group consisting of Ca, Sr, and Ba) on a substrate;

epitaxially growing a single-crystal membrane having a perovskite structure on the sacrificial layer; and selectively removing the sacrificial layer using an etchant.

Hereinafter, the manufacturing method of the present invention is described in detail step by step.

The manufacturing method of the present invention includes a step of applying an oxygen-deficient perovskite sacrificial layer with an $ACuO_2$ structure (where A is at least one selected from the group consisting of Ca, Sr, and Ba) on a substrate. The existing method for manufacturing a free-standing single-crystal membrane used a method of physically separating the membrane (remote epitaxy technique). In the remote epitaxy, a two-dimensional material with a relatively weak van der Waals bond is sandwiched between a single-crystal substrate and an epi-thin film, and after growing the thin film, mechanical exfoliation is used to separate the upper thin film from the lower substrate to create a free-standing membrane. However, in the case of mechanical exfoliation like this, there is a problem that the membrane may be damaged during the exfoliation process. In addition, in the existing technique using a sacrificial layer, a sacrificial layer that can be chemically removed by distilled water or an etchant such as acid/base is deposited between the lower substrate and the upper thin film, and then the epitaxially grown thin film is separated from the substrate by selectively removing the sacrificial layer during the etching process on the fabricated film, thereby creating a free-standing membrane. According to previous studies reported to date, $Sr_3Al_2O_6$, which is soluble in distilled water, and $(La,Sr)MnO_3$, which can be etched using acidic solutions, are representative compounds that have been used as sacrificial layers. However, the $Sr_3Al_2O_6$ sacrificial layer is known to be etched by dissolving in distilled water only in an oxygen-deficient state (i.e., $Sr_3Al_2O_{6-\delta}$), and the (La, Sr) $MnO_3$ sacrificial layer is known to be etched only in acidic solutions. Unlike these, in the manufacturing method of the present invention, an oxygen-deficient perovskite sacrificial layer with an $ACuO_2$ structure (where A is at least one selected from the group consisting of Ca, Sr, and Ba) is applied on a substrate. In other words, an oxygen-deficient perovskite sacrificial layer with an $ACuO_2$ structure (where A is at least one selected from the group consisting of Ca, Sr, and Ba) is used as a sacrificial layer, which enables etching in various etching environments such as distilled water, acidic solutions, or basic solutions.

On the other hand, the step of applying a sacrificial layer can be carried out in various ways, for example by pulsed laser deposition.

The manufacturing method of the present invention includes a step of epitaxially growing a single-crystal membrane having a perovskite structure on the sacrificial layer, wherein the step of epitaxially growing a single-crystal membrane can be performed using a known method such as pulsed laser deposition.

The method for manufacturing a free-standing single-crystal membrane having a perovskite structure of the present invention includes a step of selectively removing the sacrificial layer using an etchant after the epi-growth of single-crystal membrane having a perovskite the structure has been terminated as described above. In the present invention, an oxygen-deficient perovskite material with an $ACuO_2$ structure (where A is at least one selected from the group consisting of Ca, Sr, and Ba) is used as a sacrificial layer, which is highly reactive with other anions and therefore can be etched using a variety of etchant solutions.

In this way, when the sacrificial layer is selectively removed using an etchant, the single-crystal membrane of the epitaxially grown perovskite structure is separated from the substrate and becomes free-standing. Since the free-standing single-crystal membrane separated from the substrate is free from above-mentioned substrate clamping effect, it has the advantage of being able to freely adjust the strain state of the membrane.

On the other hand, the $ACuO_2$ structure used as a sacrificial layer in the manufacturing method of the present invention may be a planar structure or a chain structure. The planar structure is a structure like the one on the left in FIG. 1, and the chain structure is a structure like the one on the right in FIG. 1. As shown in FIG. 1, since both the planar structure and the chain structure have areas where oxygen is deficient on the plane, etching can be easily performed using various etchants containing anions.

In the manufacturing method of the present invention, the substrate on which the sacrificial layer is applied is a support substrate for supporting the layers formed thereon. Specifically, it is preferred that the substrate is one selected from a group of single crystal substrates having various lattice constants, such as $SrTiO_3$ (0.3905 nm), $(LaAlO_3)_{0.3}$—$(Sr_2AlTaO_6)_{0.7}$ (LSAT) (0.387 nm), and $LaAlO_3$ (0.3789 nm), for the reason that 'the crystal structure of the substrate has a perovskite structure'.

In the manufacturing method of the present invention, the single-crystal membrane epitaxially grown on the sacrificial layer may be a single membrane selected from a group of materials having a perovskite crystal structure such as $SrRuO_3$, $CaRuO_3$, $(Sr,Ca)RuO_3$, $BaTiO_3$, $SrTiO_3$, $BaZrO_3$, and $Bi(Na,K)TiO_3$. Depending on the type of oxygen-deficient perovskite used as the sacrificial layer, the single-crystal membrane having a perovskite structure epitaxially grown thereon may vary.

The etchant that can be used to etch the sacrificial layer in the manufacturing method of the present invention may be distilled water, an acidic solution, or a basic solution. As described above, since the present invention oxygen-deficient perovskite material as uses an a sacrificial layer, it is highly reactive to various etchants containing anions, and thus enables selective etching using various types of etchants or in various etching environments. Through this, there is an advantage that the membrane can be separated from the substrate at various speeds without damaging the single-crystal membrane having the epitaxially grown perovskite structure.

Meanwhile, the manufacturing method of the present invention may further include a step of forming a protective layer on the epitaxially grown single-crystal membrane after epitaxially growing the single-crystal membrane and before selectively removing the sacrificial layer using an etchant. The protective layer serves to protect the epitaxially grown single-crystal membrane having a perovskite structure from the etchant used in subsequent processing, protects the single-crystal membrane from damage when it is separated from the support substrate after etching, and facilitates easy transfer to a substrate for manufacturing devices, allowing a membrane of better quality to be obtained.

At this time, the protective layer that can be used may be polydimethylenesiloxane (PDMS), polymethyl methacrylate (PMMA), or polystyrene (PS). They are suitable for use as a protective layer in the present invention because they can be easily applied on a single-crystal membrane by mixing two types of liquid solutions or dissolving them in a polar solvent to form a protective film, and can be easily separated or dissolved and removed from the membrane after the etching and transfer process, or removed by melting.

According to the manufacturing method of the present invention, a free-standing single-crystal membrane having a perovskite structure can be easily manufactured in various etching environments, which has the effect of enabling excellent quality membranes to be manufactured at various speeds as needed.

In addition, the present invention provides a method for transferring a free-standing single-crystal membrane having a perovskite structure comprising the following steps:

applying an oxygen-deficient perovskite sacrificial layer with an (where A is at least one selected from the group consisting of calcium (Ca), strontium (Sr), and barium (Ba)) on a substrate;

epitaxially growing a single-crystal membrane having a perovskite structure on the sacrificial layer;

selectively removing the sacrificial layer using an etchant; and transferring the free-standing single-crystal membrane having a perovskite structure to a quartz z substrate by removing the sacrificial layer.

Hereinafter, the transferring method of the present invention is described in detail step by step.

The transferring method of the present invention includes a step of applying an oxygen-deficient perovskite sacrificial layer with an $ACuO_2$ structure (where A is at least one selected from the group consisting of Ca, Sr, and Ba) on a substrate. The existing method for transferring a free-standing single-crystal membrane used a method of physically separating the membrane (remote epitaxy technique). In the remote epitaxy, a two-dimensional material with a relatively weak van der Waals bond is sandwiched between a single-crystal substrate and an epi-thin film, and after growing the thin film, mechanical exfoliation is used to separate the upper thin film from the lower substrate to create a free-standing membrane. Then, the free-standing membrane is transferred. However, in the case of mechanical exfoliation like this, there is a problem that the membrane may be damaged during the exfoliation process. In addition, in the existing technique using a sacrificial layer, a sacrificial layer that can be chemically removed by distilled water or an etchant such as acid/base is deposited between the lower substrate and the upper thin film, and then the epitaxially grown thin film is separated from the substrate by selectively removing the sacrificial layer during the etching process on the fabricated film, thereby creating and transferring a free-standing membrane. According to previous studies reported to date, $Sr_3Al_2O_6$, which is soluble in distilled water, and $(La,Sr)MnO_3$, which can be etched using acidic solutions, are representative compounds that have been used as sacrificial layers. However, the $Sr_3Al_2O_6$ sacrificial layer is known to be etched by dissolving in distilled water only in an oxygen-deficient state (i.e., $Sr_3Al_2O_{6-\delta}$), and the (La, Sr)$MnO_3$ sacrificial layer is known to be etched only in acidic solutions. Unlike these, in the transferring method of the present invention, an oxygen-deficient perovskite sacrificial layer with an $ACuO_2$ structure (where A is at least one selected from the group consisting of Ca, Sr, and Ba) is applied on a substrate. In other words, an oxygen-deficient perovskite sacrificial layer with an $ACuO_2$ structure (where A is at least one selected from the group consisting of Ca, Sr, and Ba) is used as a sacrificial layer, which enables etching in various etching environments such as distilled water, acidic solutions, or basic solutions.

On the other hand, the step of applying a sacrificial layer can be carried out in various ways, for example by pulsed laser deposition.

The transferring method of the present invention includes a step of epitaxially growing a single-crystal membrane having a perovskite structure on the sacrificial layer, wherein the step of epitaxially growing a single-crystal membrane can be performed using a known method such as pulsed laser deposition.

The method for transferring a free-standing single-crystal membrane having a perovskite structure of the present invention includes a step of selectively removing the sacrificial layer using an etchant after the epi-growth of the membrane single-crystal having a perovskite structure has been terminated as described above. In the present invention, an oxygen-deficient perovskite material with an $ACuO_2$ structure (where A is at least one selected from the group consisting of Ca, Sr, and Ba) is used as a sacrificial layer, which is highly reactive with other anions and therefore can be etched using a variety of etchant solutions.

In this way, when the sacrificial layer is selectively removed using an etchant, the single-crystal membrane of the epitaxially grown perovskite structure is separated from the substrate and becomes free-standing. Since the free-standing single-crystal membrane separated from the substrate is free from the above-mentioned substrate clamping effect, it has the advantage of being able to freely adjust the strain state of the membrane.

The transferring method of the present invention includes a step of transferring the formed free-standing membrane having a perovskite structure onto a quartz substrate, and such transferring can be performed through a known method.

On the other hand, the $ACuO_2$ structure used as a sacrificial layer in the transferring method of the present invention may be a planar structure or a chain structure. The planar structure is a structure like the one on the left in FIG. 1, and the chain structure is a structure like the one on the right in FIG. 1. As shown in FIG. 1, since both the planar structure and the chain structure have areas where oxygen is deficient on the plane, etching can be easily performed using various etchants containing anions.

In the transferring method of the present invention, the substrate on which the sacrificial layer is applied is a support substrate for supporting the layers formed thereon. Specifically, it is preferred that the substrate is one selected from a group of single crystal substrates having various lattice constants, such as $SrTiO_3$ (0.3905 nm), $(LaAlO_3)_{0.3}$—$(Sr_2AlTaO_6)_{0.7}$ (LSAT) (0.387 nm), and $LaAlO_3$ (0.3789 nm), for the reason that 'the crystal structure of the substrate has a perovskite structure'.

In the transferring method of the present invention, the single-crystal membrane epitaxially grown on the sacrificial layer may be a single membrane selected from a group of materials having a perovskite crystal structure such as $SrRuO_3$, $CaRuO_3$, (Sr,Ca) $RuO_3$, $BaTiO_3$, $SrTiO_3$, $BaZrO_3$, and $Bi(Na,K)TiO_3$. Depending on the type of oxygen-deficient perovskite used as the sacrificial layer, the single-crystal membrane having a perovskite structure epitaxially grown thereon may vary.

The etchant that can be used to etch the sacrificial layer in the transferring method of the present invention may be distilled water, an acidic solution, or a basic solution. As described above, since the present invention uses an oxygen-deficient perovskite material as a sacrificial layer, is it highly reactive to various etchants containing anions, thus enables selective and etching using various types of etchants or in various etching environments. Through this, there is an advantage that the membrane can be separated from the substrate at various speeds without damaging the single-crystal membrane having the epitaxially grown perovskite structure.

Meanwhile, the transferring method of the present invention may further include a step of forming a protective layer on the epitaxially grown single-crystal membrane after epitaxially growing the single-crystal membrane and before selectively removing the sacrificial layer using an etchant. The protective layer serves to protect the epitaxially grown single-crystal membrane having a perovskite structure from the etchant used in subsequent processing, protects the single-crystal membrane from damage when it is separated from the support substrate after etching, and facilitates easy transfer to a substrate for manufacturing devices, allowing a membrane of better quality to be obtained.

At this time, the protective layer that can be used may be polydimethylenesiloxane (PDMS), polymethyl methacrylate (PMMA), or polystyrene (PS). They are suitable for use as a protective layer in the present invention because they can be easily applied on a single-crystal membrane by mixing two types of liquid solutions or dissolving them in a polar solvent to form a protective film, and can be easily separated or dissolved and removed from the membrane after the etching and transfer process, or removed by melting.

The transferring method of the present invention may further include a step of removing the protective layer after transferring the free-standing single-crystal membrane having a perovskite structure to the quartz substrate by removing the sacrificial layer. In this way, by removing the protective layer after the transfer is completed, it is possible to prevent the epitaxially grown single-crystal membrane having a perovskite structure from being damaged during the transfer process.

According to the transferring method of the present invention, a free-standing single-crystal membrane having a perovskite structure can be easily manufactured and transferred in a variety of etching environments, and thus a membrane of excellent quality can be transferred at various speeds as needed.

Hereinafter, the manufacturing method and transferring method of the present invention is described in more detail with reference to the drawings. However, the following description is intended to specifically explain the manufacturing method and transferring method of the present invention, and is not intended to limit the claims of the present invention by the following description.

Figure 2:
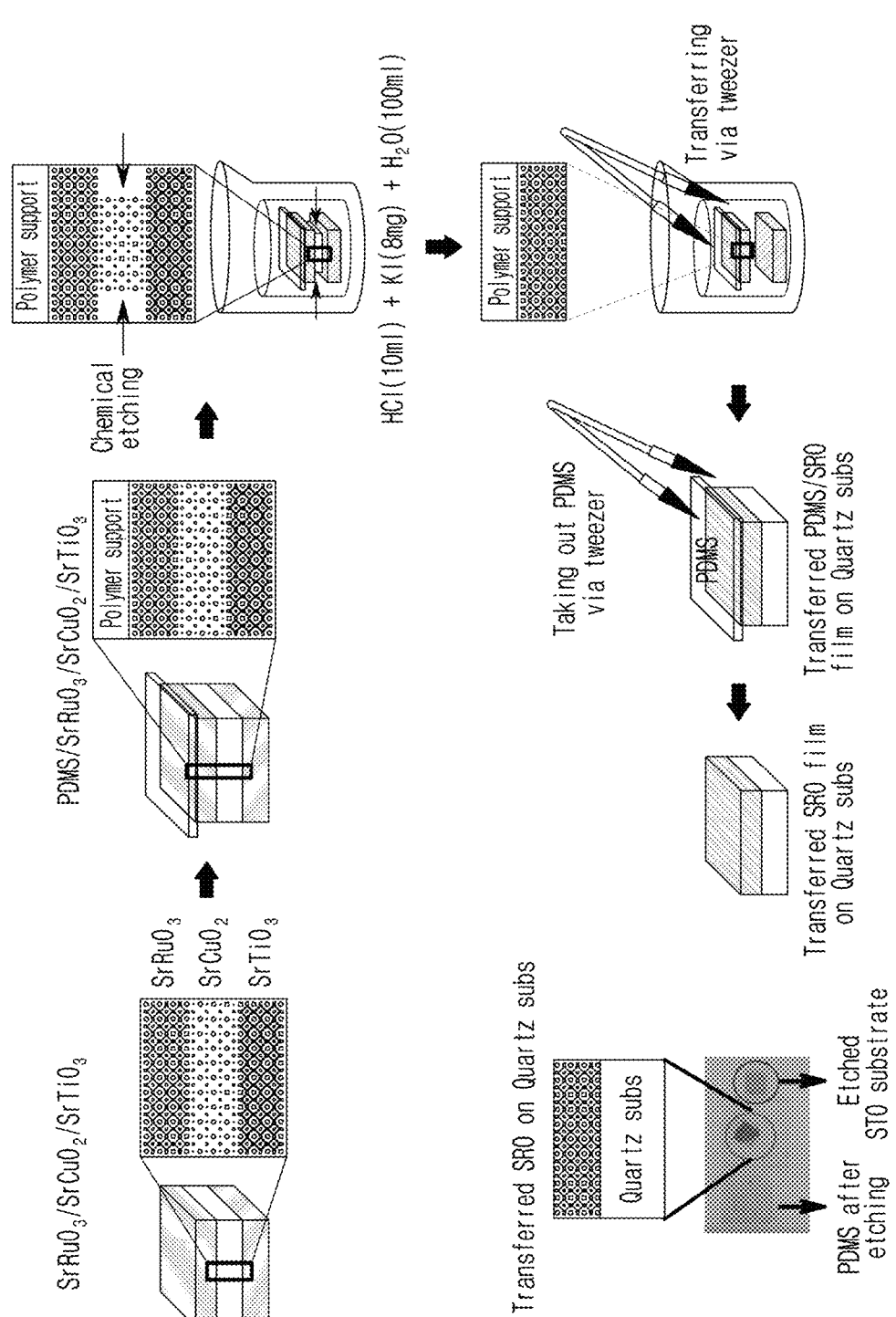
FIG. 2 is a schematic diagram showing one example of the manufacturing method and transfer method of the present invention.

FIG. 2 is a schematic diagram showing one example of the manufacturing method and transfer method of the present invention. FIG. 2 schematically shows the method for manufacturing a membrane and the method for transferring the manufactured membrane of the present invention. A $SrCuO_2$ sacrificial layer was formed on the $SrTiO_3$ substrate, and a $SrRuO_3$ single-crystal membrane was epitaxially grown thereon. Afterward, a PDMS protective layer was formed on the membrane. When the product formed in this way was immersed in an etching solution in a beaker, only the sacrificial layer was selectively etched, thereby separating the $SrRuO_3$ membrane from the $SrTiO_3$ substrate. The separated $SrRuO_3$ membrane was removed from the beaker using a tweezer and transferred to a quartz substrate. After the transfer was complete, the upper PDMS protective layer was removed using a tweezer to obtain a $SrRuO_3$ membrane transferred onto the quartz substrate.

Experimental Example 1

To determine whether the sacrificial layer of the present invention responds well to various etchants, the following experiment was performed.

The information regarding the etching of the $Sr_3Al_2O_6$ and $(La,Sr)MnO_3$ sacrificial layers shown in Table 1 below is described in the following literatures.

[D. Lu, et al., Nat. Mater. 15, 1255 (2016); Hong et al., Sci. Adv. 3, eaao5173 (2017); D. Ji, et al., Nature 570, 87 (2019); Z. Chen, et al., Phys. Rev. Mater. 3, 060801(R) (2019); Z. Lu, et al., APL Mater. 8, 051105 (2020); S. R. Bakaul, et al., Nat. Commun. 7, 10547 (2016); S. R. Bakaul, et al., Adv. Mater. 29, 1605699 (2017); H. Elangovan, et al., ACS Nano 14, 5053 (2020)]

Meanwhile, to test the reaction of the $SrCuO_2$ sacrificial layer to the etchant, a single-layer $SrCuO_2$ thin film was grown on the $SrTiO_3$ single-crystal substrate using pulsed laser epitaxy. The etching rate was experimentally calculated by immersing the deposited $SrCuO_2$ thin film in various etching solutions and monitoring the change in color of the specimen according to etching (The color of the grown $SrCuO_2$ thin film is black, and as etching progresses, the color of the specimen changes to the color of the $SrTiO_3$ substrate, which is opaque white). After etching, X-ray diffraction analysis was performed to confirm that the $SrCuO_2$ thin film was etched.

The experimental results are summarized in Table 1 below.

TABLE 1

| Sacrificial layer material | Water | KOH solution | KI solution |
|---|---|---|---|
| $Sr_3Al_2O_6$ | Dissolved in minutes | Dissolved after 1 day | None reported |
| $La_{0.3}Sr_{0.7}MnO_3$ | Not dissolved | Not dissolved | Dissolved after 1-2 days |
| $SrCuO_2$ | Dissolved in 90 minutes | Dissolved in 2-7 days | Dissolved in 30 minutes |

According to the results in Table 1, it was confirmed that the $SrCuO_2$ actually used in the manufacturing method and transferring method of the present invention was soluble in all etchants including water, basic solutions, and acidic solutions, whereas the conventional materials used as a sacrificial layer were soluble only in certain environments, that is, neutral, acidic, or basic environments.

Experimental Example 2

Preparation of $SrTiO_3$ Substrate

A $SrTiO_3$ substrate was chemically etched using a buffered oxidizing etchant (J.T. Baker, USA) for 1 minute and 30 seconds and washed with distilled water for 1 minute and 30 seconds. Afterwards, it was heated at 950° C. for 3 hours in a tube furnace.

Formation of $SrCuO_2$ Sacrificial Layer

A $SrCuO_2$ sacrificial layer was deposited by pulsed laser deposition to a thickness of about 20-25 nm. The $SrCuO_2$ thin film was deposited on a $SrTiO_3$ substrate under the conditions of an oxygen atmosphere of $10^{-7}$ to 100 mTorr and a substrate temperature of 600 to 650° C. using a $SrCuO_2$ ceramic target prepared by a general solid-state reaction method. The laser energy density irradiated to the target during deposition was approximately 1.0 to 1.5 $J/cm^2$. The formation of a planar $SrCuO_2$ thin film was confirmed through XRD analysis (see FIG. 3). The planar $SrCuO_2$ thin film with an epitaxially grown membrane layer and easy etchability could be grown under an oxygen atmosphere of 50 to 100 mTorr and a substrate temperature of 620° C.

Formation of $SrRuO_3$ Thin Film Through Epi-Growth

A $SrRuO_3$ thin film was deposited by pulsed laser deposition to a thickness of about 10-20 nm. The $SrRuO_3$ thin film was deposited under the conditions of an oxygen atmosphere of 100 mTorr and a substrate temperature of 580 to 620° C. using a $SrRuO_3$ ceramic target prepared by a general solid-state reaction method. The laser energy density irradiated to the target during deposition was approximately 1.0 to 1.5 $J/cm^2$. The formation of the epitaxially grown $SrRuO_3$ thin film was confirmed through XRD analysis (see FIG. 3).

Formation of Protective Layer

To form a polydimethylenesiloxane (PDMS) protective layer, first, a silicone elastomer kit (Dow Chemical, SYL-GARD 184) was mixed, the film was applied to a glass plate, and then hardened to prepare a PDMS film with a thickness of approximately 0.5 mm. The prepared PDMS film was cut and pressed well onto the epitaxially grown $SrRuO_3$ thin film to form a protective layer.

Chemical Etching

The sample with the protective layer formed was immersed in distilled water, 0.44 mM KOH solution, or 1.8 M KI solution, and the $SrCuO_2$ sacrificial layer was etched until the $SrRuO_3$ membrane layer was separated.

Free-Standing Single-Crystal Membrane Transfer

After etching the sacrificial layer, the single-crystal membrane attached to the protective layer was transferred to a quartz substrate, and the PDMS protective layer was separated to transfer the free-standing single-crystal membrane to the quartz substrate.

Figures 3, 4:
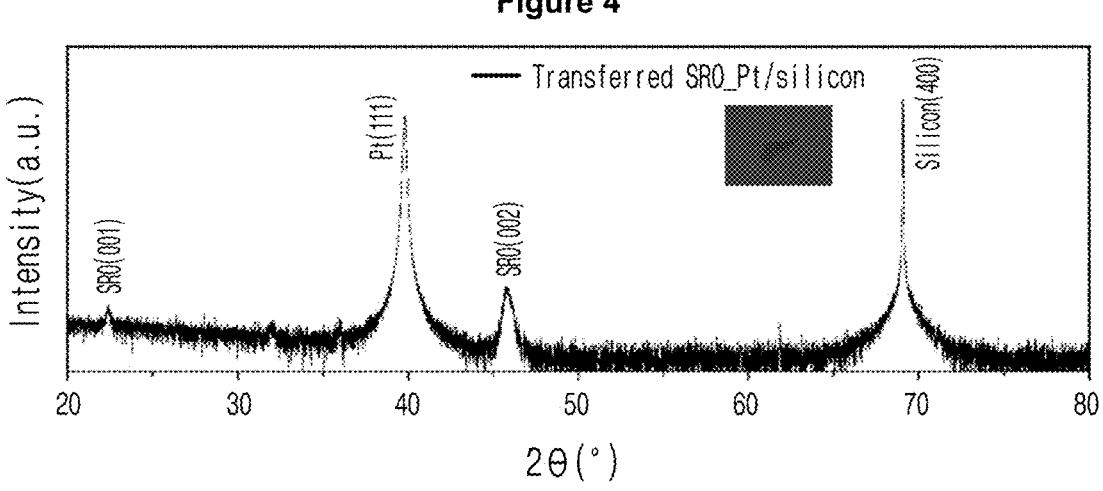
FIG. 3 is an XRD graph showing the $SrCuO_2$ sacrificial layer and the $SrRuO_3$ single-crystal membrane grown on a substrate according to the manufacturing method of the present invention.
FIG. 4 is an XRD graph showing the single-crystal membrane transferred onto a platinum-coated silicon substrate according to the manufacturing method of the present invention.

X-ray diffraction analysis was performed for the free-standing single-crystal membrane having a perovskite structure obtained by the above method, and the results are shown in FIG. 4. As shown in FIG. 4, the crystal structure of the transferred single-crystal membrane was found to maintain the pure perovskite $SrRuO_3$ crystal structure with no damage or secondary phase formation.

Experimental Example 3

Preparation of SrTiO₃ Substrate

A $SrTiO_3$ substrate was chemically etched using a buffered oxidizing etchant (J.T. Baker, USA) for 1 minute and 30 seconds and washed with distilled water for 1 minute and 30 seconds. Afterwards, it was heated at 950° C. for 3 hours in a tube furnace.

CaCuO₂ Sacrificial Layer

Figure 5:
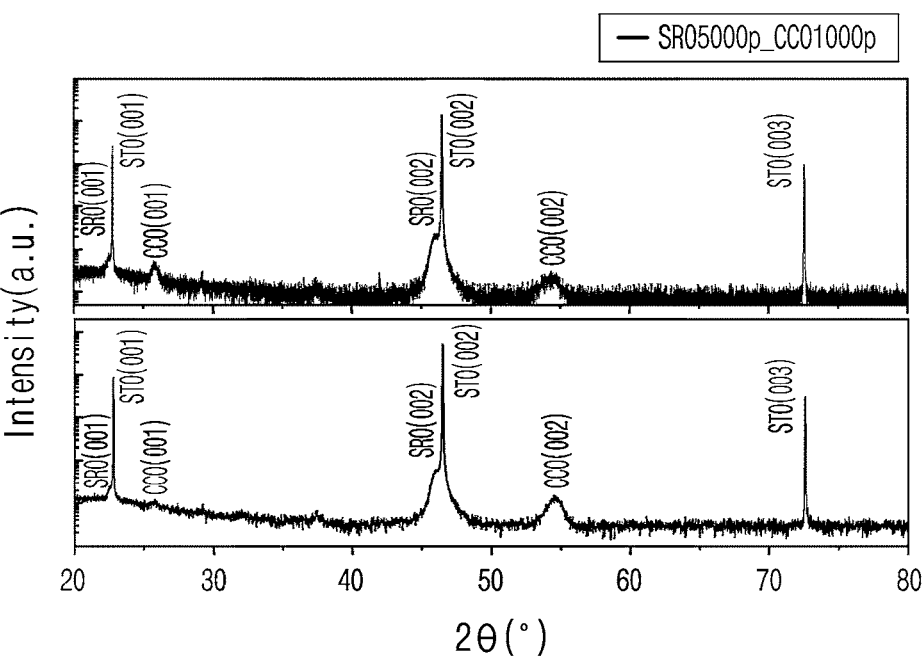
FIG. 5 is a set of other XRD graphs showing the $CaCuO_2$ sacrificial layer and the $SrRuO_3$ single-crystal membrane grown on a substrate according to the manufacturing method of the present invention.

A $CaCuO_2$ sacrificial layer was deposited by pulsed laser deposition to a thickness of about 20-25 nm. The $CaCuO_2$ thin film was deposited on a $SrTiO_3$ substrate under the conditions of an oxygen atmosphere of $10^{-7}$ to 100 mTorr and a substrate temperature of 600 to 650° C. using a $CaCuO_2$ ceramic target prepared by a general solid-state reaction method. The laser energy density irradiated to the target during deposition was approximately 1.0 to 1.5 J/cm². The formation of a planar $CaCuO_2$ thin film was confirmed through XRD analysis (see FIG. 5). The planar $CaCuO_2$ thin film with an epitaxially grown membrane layer and easy etchability could be grown under an oxygen atmosphere of 50 to 100 mTorr and a substrate temperature of 620° C.

Formation of SrRuO₃ Thin Film Through Epi-Growth

A $SrRuO_3$ thin film was deposited by pulsed laser deposition to a thickness of about 10-20 nm. The $SrRuO_3$ thin film was deposited under the conditions of an oxygen atmosphere of 100 mTorr and a substrate temperature of 580 to 620° C. using a $SrRuO_3$ ceramic target prepared by a general solid-state reaction method. The laser energy density irradiated to the target during deposition was approximately 1.0 to 1.5 J/cm². The formation of the epitaxially grown $SrRuO_3$ thin film was confirmed through XRD analysis (see FIG. 5).

Formation of Protective Layer

To form a polydimethylenesiloxane (PDMS) protective first, a silicone elastomer kit (Dow Chemical, layer, SYL-GARD 184) was mixed, the film was applied to a glass plate, and then hardened to prepare a PDMS film with a thickness of approximately 0.5 mm. The prepared PDMS film was cut and pressed well onto the epitaxially grown $SrRuO_3$ thin film to form a protective layer.

Chemical Etching

The sample with the protective layer formed was immersed in distilled water, 0.44 mM KOH solution, or 1.8 M KI solution, and the $SrCuO_2$ sacrificial layer was etched until the $SrRuO_3$ membrane layer was separated.

Free-Standing Single-Crystal Membrane Transfer

After etching the sacrificial layer, the single-crystal membrane attached to the protective layer was transferred to a quartz substrate, and the PDMS protective layer was separated to transfer the free-standing single-crystal membrane to the quartz substrate.

Figure 6:
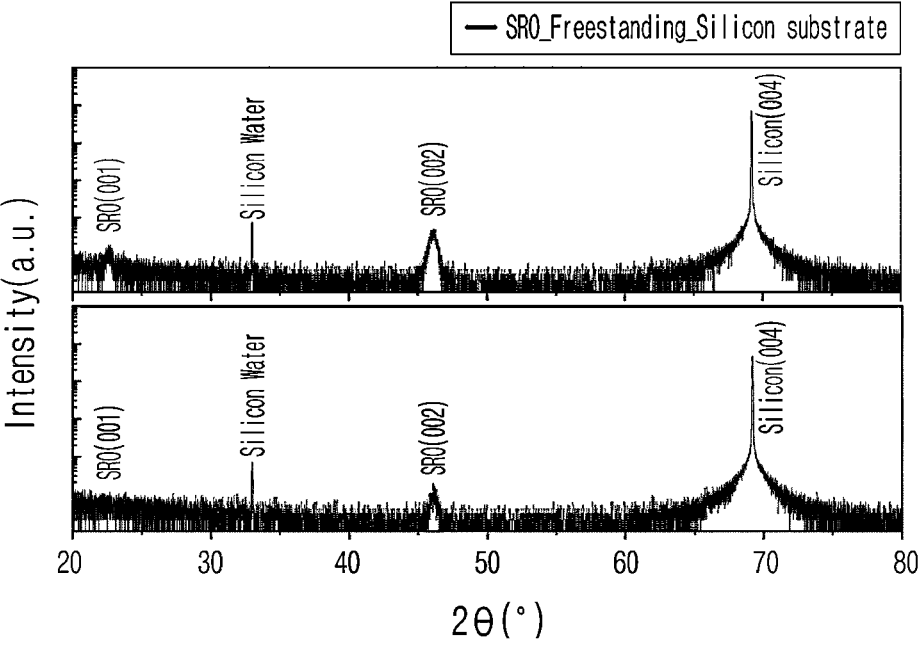
FIG. 6 is a set of other XRD graphs showing the single-crystal membrane transferred onto a silicon substrate according e manufacturing method of the present invention.

X-ray diffraction analysis was performed for the free-standing single-crystal membrane having a perovskite structure obtained by the above method, and the results are shown in FIG. 6. As shown in FIG. 6, the crystal structure of the transferred single-crystal membrane was found to maintain the pure perovskite $SrRuO_3$ crystal structure with no damage or secondary phase formation.

What is claimed is:

1. A method for manufacturing a free-standing single-crystal membrane having a perovskite structure comprising the following steps:

applying an oxygen-deficient perovskite sacrificial layer with an $SrCuO_2$ structure on a substrate;

epitaxially growing a single-crystal membrane having the perovskite structure on the sacrificial layer; and selectively removing the sacrificial layer using an etchant, wherein the single-crystal membrane is freed from the substrate, wherein the etchant is an acidic solution.

2. The method for manufacturing the free-standing single-crystal membrane having the perovskite structure according to claim 1, wherein the $SrCuO_2$ structure is a planar structure or a chain structure.

3. The method for manufacturing the free-standing single-crystal membrane having the perovskite structure according to claim 1, wherein the substrate is a single-crystal substrate having a perovskite crystal structure selected from the group consisting of $SrTiO_3$, $(LaAlO_3)_{0.3}$—$(Sr_2AlTaO_6)_{0.7}$ (LSAT), and $LaAlO_3$.

4. The method for manufacturing the free-standing single-crystal membrane having the perovskite structure according to claim 1, wherein the epitaxially growing single-crystal membrane is a perovskite crystal structure membrane selected from the group consisting of $SrRuO_3$, $CaRuO_3$, $(Sr,Ca)RuO_3$, $BaTiO_3$, $SrTiO_3$, $BaZrO_3$, and $Bi(Na,K)TiO_3$.

5. The method for manufacturing the free-standing single-crystal membrane having the perovskite structure according to claim 1, wherein the method further includes a step of forming a protective layer on the epitaxially grown single-crystal membrane after epitaxially growing the single-crystal membrane and before selectively removing the sacrificial layer using the etchant.

6. The method for manufacturing the free-standing single-crystal membrane having the perovskite structure according to claim 5, wherein the protective layer is one selected from the group consisting of polydimethylenesiloxane (PDMS), polymethyl methacrylate (PMMA), and polystyrene (PS).

* * * * *